United States Patent [19]
Miyake et al.

[11] Patent Number: 5,770,335
[45] Date of Patent: Jun. 23, 1998

[54] MASK AND EXPOSURE APPARATUS USING THE SAME

[75] Inventors: Akira Miyake; Keiko Chiba, both of Utsunomiya, Japan

[73] Assignee: Canon Kabushiki Kaisha, Tokyo, Japan

[21] Appl. No.: 687,782

[22] Filed: Jul. 31, 1996

[30]     Foreign Application Priority Data

Aug. 2, 1995  [JP]  Japan .................................... 7-197543

[51] Int. Cl.$^6$ ................. G03F 9/00; G21K 5/00
[52] U.S. Cl. ................. 430/5; 430/396; 378/34; 378/35
[58] Field of Search ............... 430/5, 396, 966; 378/35, 34

[56]     References Cited

U.S. PATENT DOCUMENTS

| | | | |
|---|---|---|---|
| 4,735,877 | 4/1988 | Kato et al. | 430/5 |
| 5,394,451 | 2/1995 | Miyake et al. | 378/34 |
| 5,418,095 | 5/1995 | Vasudev et al. | 430/5 |
| 5,422,921 | 6/1995 | Chiba | 378/34 |
| 5,469,489 | 11/1995 | Miyake et al. | 378/35 |
| 5,472,811 | 12/1995 | Vasudev et al. | 430/5 |
| 5,503,950 | 4/1996 | Miyake et al. | 430/5 |
| 5,553,110 | 9/1996 | Sentoku et al. | 378/35 |

FOREIGN PATENT DOCUMENTS 5-003146  1/1993  Japan .

*Primary Examiner*—George F. Lesmes
*Assistant Examiner*—Chedyl Juska
*Attorney, Agent, or Firm*—Fitzpatrick, Cella, Harper & Scinto

[57]     ABSTRACT

A mask for use with radiation including one of X-rays and vacuum ultraviolet rays. The mask includes a transmissive member for supporting a pattern of a radiation absorptive material, and a phase shifter material provided on the transmissive member. The phase shifter material has a radiation absorptivity less than that of the radiation absorptive material. The thickness of the transmissive member at a portion where the phase shifter material is provided is less than that of another portion thereof.

11 Claims, 8 Drawing Sheets

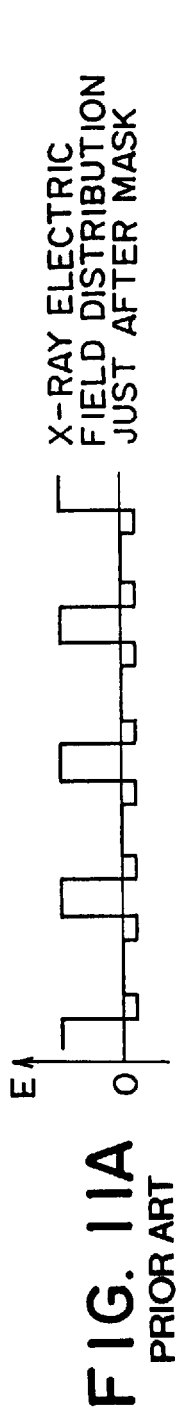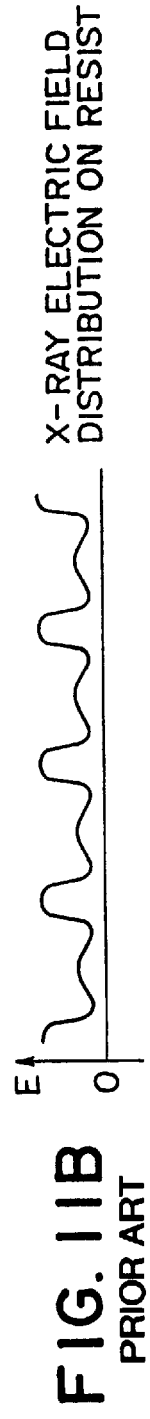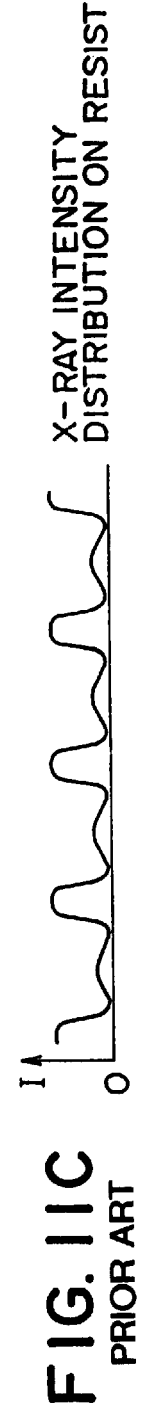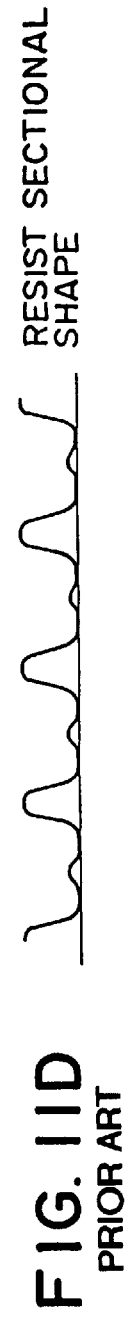
FIG. 11A PRIOR ART — X-RAY ELECTRIC FIELD DISTRIBUTION JUST AFTER MASK
FIG. 11B PRIOR ART — X-RAY ELECTRIC FIELD DISTRIBUTION ON RESIST
FIG. 11C PRIOR ART — X-RAY INTENSITY DISTRIBUTION ON RESIST
FIG. 11D PRIOR ART — RESIST SECTIONAL SHAPE

MASK AND EXPOSURE APPARATUS USING THE SAME

FIELD OF THE INVENTION AND RELATED ART

This invention relates to a mask to be used in a lithographic process for the manufacture of devices such as semiconductor devices. More particularly, the invention is concerned with a mask for an exposure process, based on a phase shift method.

Japanese Laid-Open Patent Application, Laid-Open No. 3146/1993 shows a phase shift mask for X-ray lithography which uses an interference effect of X-rays. As shown in FIG. 10, it comprises an X-ray transmission film (membrane) 1 on which an absorptive material pattern 2 is formed. Phase shift layers 3 made of a material having an X-ray transmissivity different from that of the absorptive material 2 are provided at side walls of the absorptive material pattern 2. As an example, the membrane 1 may be made of silicon nitride of a thickness 3 microns, the absorptive material 2 may be made of tungsten of a thickness 0.7 micron, and the phase shift layer 3 may be made of tantalum oxide of a width 0.125 micron and a thickness 0.7 micron.

It is so designed that X-rays passed through the phase shift layer 3 and the membrane 1 have a phase different by $\pi$ from the phase of X-rays passed only through the membrane 1. Due to interference of these X-rays, an intensity distribution shape of X-rays absorbed by a resist becomes sharp, and exposure resolution increases.

However, a phase shift mask such as above involves a problem as below. That is, the intensity of X-rays passing through the phase shift layer 3 and the membrane 1 decreases, by X-ray absorption by the phase shift layer 3, as compared with the X-rays passing through the membrane 1 only. This results in insufficient interference effect in the phase shift process. Practically, the intensity distribution of X-rays absorbed by the resist does not have a very sharp shape.

FIGS. 11A–11D illustrate this. The graph of FIG. 11A shows a distribution of electric field of an X-rays just after passing the phase shift mask of FIG. 10. It is seen that the phase of the X-rays passing the shifter is inverted, but the amplitude is reduced. The X-rays passed through the mask impinge and sensitize the resist spaced by several tens of microns. The graph of FIG. 11B shows a distribution of an X-ray electric field upon the resist. It is seen that the X-ray distribution on the resist is dull as compared with the distribution just after the mask, due to the effect of diffraction of the X-rays, for example. The graph of FIG. 11C shows an X-ray intensity distribution on the resist. The X-ray intensity upon the resist is proportional to the square of the X-ray electric field. The graph of FIG. 11D shows a resist sectional shape which is finally defined by exposing a negative type resist by using this type of mask. It is seen from these drawings that, when a conventional phase shift mask is used, the X-ray intensity distribution absorbed by a resist is not very sharp and the shape of a resultant resist pattern is damaged. It is therefore not easy to obtain a very high resolution as expected.

SUMMARY OF THE INVENTION

It is accordingly an object of the present invention to provide a mask by which the shape of an intensity distribution of exposure light absorbed by a resist can be made sharp and by which exposure resolution can be improved significantly.

It is another object of the present invention to provide an exposure apparatus using such a mask and/or a device manufacturing method using such a mask.

In accordance with an aspect of the present invention, there is provided a mask having a transmissive member on which a mask pattern is formed, characterized in that the thickness of the transmissive member is different in accordance with the pattern.

In accordance with another aspect of the present invention, there is provided a mask, comprising: a transmissive member for supporting a pattern of an absorptive material; and a phase shifter having a radiation absorptivity smaller than that of the absorptive material; wherein the thickness of the transmissive member at a portion where the phase shifter is provided is smaller than that of another portion thereof.

In one preferred form of this aspect of the present invention, radiation passed through the portion where the phase shifter is provided and radiation passed through a portion where only the transmissive member is provided, have substantially the same intensity but have different phases being different approximately by $\pi$ radians.

In another preferred form of this aspect of the present invention, the following relations are satisfied:

$$tm = \pm ks \times \lambda/(2 \times (km \times \delta s - ks \times \delta m))$$

$$ts = \pm km \times \lambda/(2 \times (ks \times \delta m - km \times \delta s))$$

wherein tm is a surface step of the portion of the transmissive material having a different thickness and ts is the thickness of the phase shifter, $1-\delta m-ikm$ is a complex refractivity of the transmissive material, $1-\delta s-iks$ is a complex refractivity of the phase shifter and $\lambda$ is the wavelength of the radiation.

In a further preferred form of this aspect of the present invention, the absorptive material and the phase shifter are made of the same material.

In a yet further preferred form of this aspect of the present invention, the radiation comprises one of X-rays and vacuum ultraviolet rays.

In accordance with a further aspect of the present invention, there is provided an exposure apparatus having means for printing a pattern on a wafer by using any mask as described above.

In accordance with a yet further aspect of the present invention, there is provided a device manufacturing method for producing a device by using any mask as described above.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

A basic principle of a mask according to the present invention is that the mask is arranged so that exposure light passed through a phase shift layer and exposure light not passed through the phase shift layer have substantially the same intensity. To this end, a portion of a membrane where a pattern of a phase shifter lies may be made partially thin (to define a surface step) to thereby reduce absorption in that portion, such that absorption as the exposure light passes the phase shifter portion may be canceled.

The following description will be made of examples where X-rays are used as exposure light. However, the present invention is not limited to this, and the invention is applicable to cases where vacuum ultraviolet rays or longer wavelengths of ultraviolet light or visible light is used.

If X-rays are used as exposure light, for example, when X-rays having a wavelength $\lambda$ pass through a material having a complex refractivity $n=1-\delta-ik$ and a thickness t, the intensity of X-rays transmitted becomes $\exp(-4\pi kt/\lambda)$ times, and the phase changes by $2\pi\delta t/\lambda$ (rad). By using these relations, the conditions for assuring the same intensity for X-rays passed through a phase shifter portion and X-rays passed through a pattern portion, but having a phase difference $\pm\pi$ rad., are:

$$tm = \pm ks \times \lambda / (2 \times (km \times \delta s - ks \times \delta m)) \quad (1)$$

$$ts = \pm km \times \lambda / (2 \times (ks \times \delta m - km \times \delta s)) \quad (2)$$

wherein tm is a surface step formed on the membrane, ts is the thickness of the phase shifter, $1-\delta m-ikm$ is a complex refractivity of the membrane, $1-\delta s-iks$ is a complex refractivity of the phase shifter and $\lambda$ is the wavelength of the X-rays.

Taking into account easiness of mask manufacture and resistivity to breakage thereof, the thickness of the shifter as well as the magnitude of the membrane surface step should desirably be as small as possible. To this end, the difference between the ratio of the imaginary portion to the real portion of the complex refractivity of the membrane and the ratio of the imaginary portion to the real portion of the complex refractivity of the shifter, should desirably be as large as possible. As regards the material for the membrane, it should have a small X-ray absorptivity, a large mechanical strength, and a size stability to irradiation with X-rays, for example. In the wavelength region of about 1 nm used in X-ray lithography, examples of preferable materials may be silicon nitride ($Si_3N_4$), silicon carbide (SiC), boron nitride (BN) and diamond. Examples of preferable materials for the phase shifter may be gold, platinum, silver, palladium, tungsten, molybdenum, tantalum, nickel, chromium, titanium, beryllium, and any other metal and a composite of any of them.

Preferred embodiments of the present invention will now be described.

[Embodiment 1]

Figure 1:
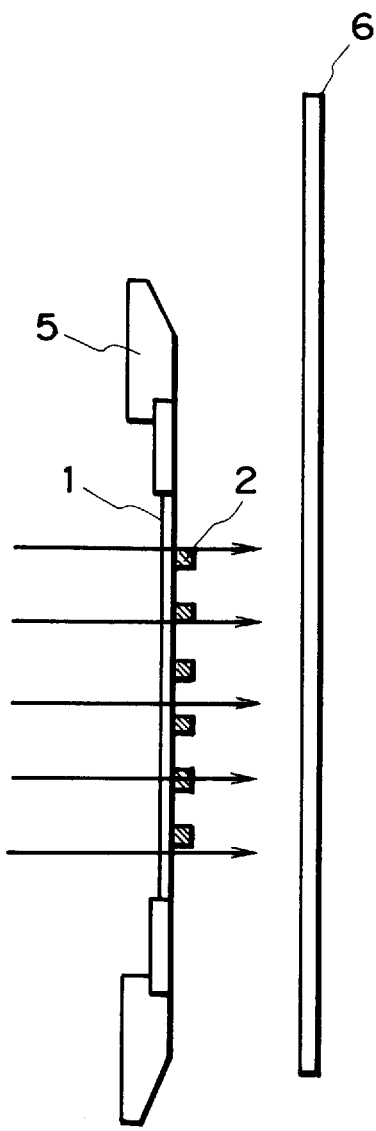
FIG. 1 is a sectional view of an X-ray phase shift mask according to a first embodiment of the present invention.

FIG. 1 illustrates a basic concept of a lithographic process using a phase shift mask. Frame 5 supports a membrane 1 on which a transfer pattern made of a radiation absorptive material 2 is formed. Wafer 6 is disposed close to the membrane 1 and, with irradiation of X-rays, the wafer is exposed and the pattern is transferred to the wafer.

Figure 2:
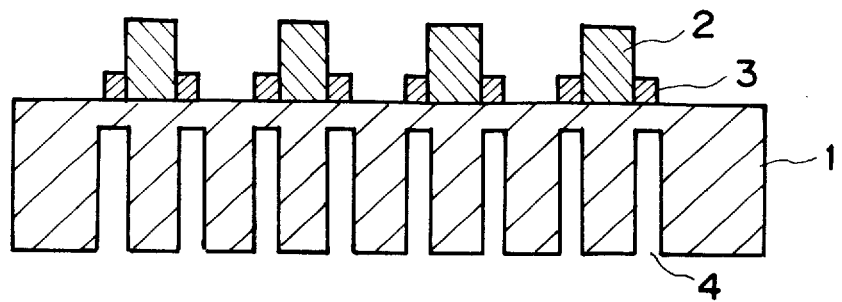
FIG. 2 is an enlarged section of a portion of the mask of FIG. 1.

FIG. 2 is an enlarged view of a portion of the phase shift mask of FIG. 1. On the membrane 1 surface, there are absorptive materials 2, forming a transfer pattern, and phase shifters 3 at the opposite sides of the absorptive materials 2. On the bottom face of the membrane 1, there are bores 4 at positions corresponding to the phase shifters 3 such that surface steps are defined. The membrane 1 comprises a silicon nitride ($Si_3N_4$) film of a thickness 2 microns. The absorptive material 2 is made of gold and has a thickness 1 micron. The phase shifter is made of chromium (Cr).

The refractivities of these materials to X-rays of a wavelength 1 nm are:

| | | | |
|---|---|---|---|
| $Si_3N_4$: | n = 1 | −0.00044 | −0.000034i |
| Cr: | n = 1 | −0.00088 | −0.00025i |

Here, calculating the optimum surface step tm of the membrane 1 and optimum thickness ts of the phase shifter in accordance with equations (1) and (2), it follows that tm=1.57 micron and ts=0.22 micron. Thus, a Cr film may be formed as the phase shifter to a thickness 0.22 micron, and bores may be formed in the portion of the membrane 1 corresponding to the shifter, to a depth 1.57 micron. By using a resultant X-ray mask, X-rays passed through the phase shifter and X-rays passed through the transmissive pattern can have the same intensity with a phase difference $\pm\pi$ rad. Thus, the phase shift effect is enhanced and the transfer performance is improved.

Figure 6A:
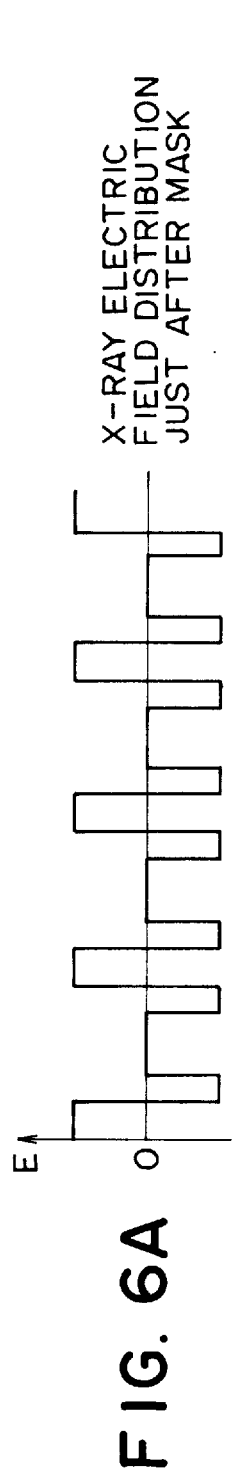
FIGS. 6A–6D are graphs, respectively, for explaining an operation with a phase shift mask according to an embodiment of the present invention.
Figure 6B:
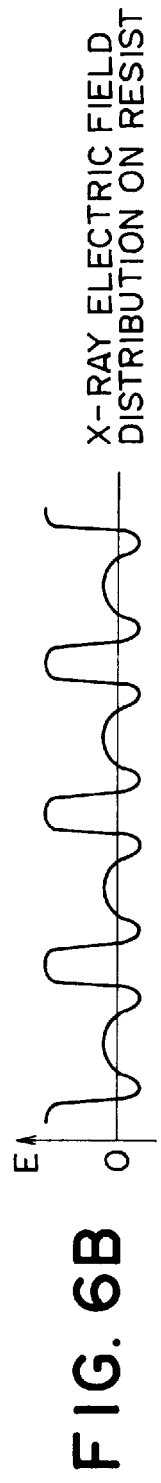
Figure 6C:
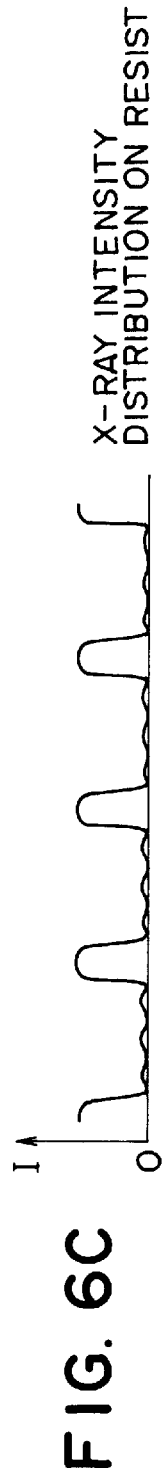
Figure 6D:
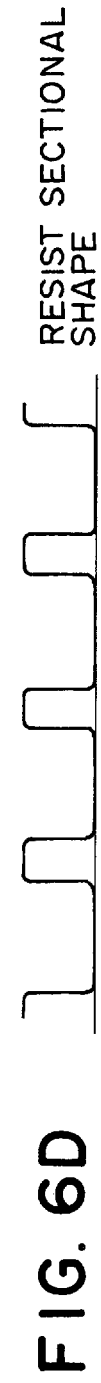

FIGS. 6A–6D illustrate this. The graph of FIG. 6A shows a distribution of electric field of an X-rays just after passing the phase shift mask of this embodiment. It is seen that the phase of the X-rays passing the shifter is inverted, and the amplitude is substantially the same as that of X-rays passed through the membrane only. The X-rays passed through the mask impinge and sensitize the resist spaced by several tens of microns. The graph of FIG. 6B shows distribution of an X-ray electric field upon the resist. The graph of FIG. 6C shows an X-ray intensity distribution on the resist. The X-ray intensity upon the resist is proportional to the square of the X-ray electric field. The graph of FIG. 6D shows a resist sectional shape which is finally defined by exposing a negative type resist by using this type of mask. As compared with the one having been described with reference to FIGS. 11A–11D, the phase shift mask of this embodiment provides a sharp X-ray intensity distribution shape and enables considerable enhancement of resolution for pattern transfer.

A mask manufacturing method according to an embodiment of the present invention is as follows. First, a shifter pattern is formed on the membrane surface in accordance with an electron beam pattern drawing process and a chromium lift-off process. Subsequently, a negative type resist is applied to the bottom surface of the membrane. Then, soft X-rays are projected to the membrane from its upper surface side, and a resist pattern is produced. Thereafter, by using this resist pattern as a mask, the membrane is etched to form bores. Finally, an absorbing material is formed on the membrane surface by means of an electron beam process and through a plating process.

[Embodiment 2]

Figure 3:
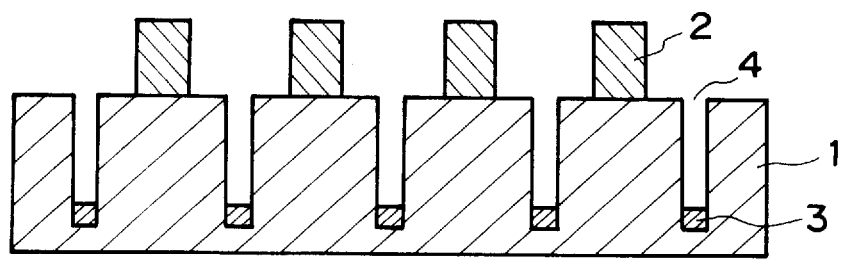
FIG. 3 is a sectional view of an X-ray phase shift mask according to a second embodiment.

FIG. 3 is an enlarged and sectional view of an X-ray phase shift mask according to a second embodiment of the present invention. In this embodiment, bores 4 are formed in the membrane 1 surface, and phase shifters 3 are provided at bottoms of the bores 4. The membrane 1 is made of a silicon carbide (SiC) film of a thickness 2 microns, the absorbing material 2 is made of tantalum (Ta) of a thickness 1 micron, and each phase shifter 3 is made of nickel (Ni). The refractivities of these materials to X-rays of a wavelength 1 nm are as follows:

| SiC | n = 1 | −0.000406 | −0.000025i |
|-----|-------|-----------|------------|
| Ni  | n = 1 | −0.00102  | −0.000471i |

Here, calculating the optimum surface step tm of the membrane 1 and optimum thickness ts of the phase shifter in accordance with equations (1) and (2), it follows that tm 32 1.42 micron and ts=0.08 micron. Thus, the depth of bore 4 of the membrane 1 may be determined as 1.42 micron, and Ni of 0.08 micron may be provided in the bore as a shifter 3.

[Embodiment 3]

Figure 4:
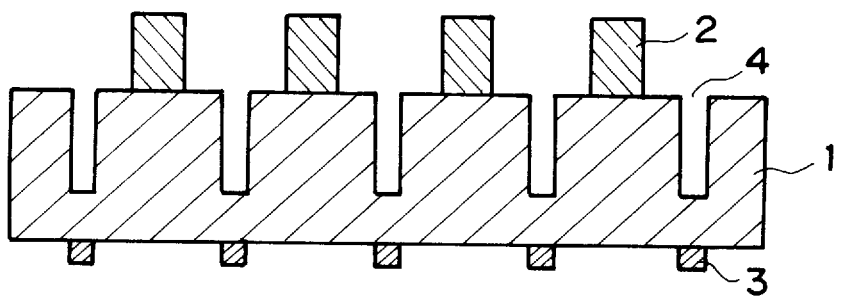
FIG. 4 is a sectional view of an X-ray phase shift mask according to a third embodiment.

FIG. 4 is an enlarged and sectional view of an X-ray phase shift mask according to a third embodiment of the present invention. In this embodiment, phase shifters 3 are provided at the bottom surface of the membrane, and bores 4 are formed on the upper surface of the membrane at positions corresponding to the phase shift pattern.

A mask manufacturing method according to this embodiment of the present invention is as follows. First, a shifter pattern is formed on the bottom surface of the membrane in accordance with an electron beam pattern drawing process and a lift-off process. Subsequently, a negative type resist is applied to the top surface of the membrane. Then, soft X-rays are projected to the membrane from its bottom surface side, and a resist pattern is produced. Thereafter, by using this resist pattern as a mask, the membrane is etched to form bores. Finally, an absorbing material pattern is formed on the membrane surface.

[Embodiment 4]

Figure 5:
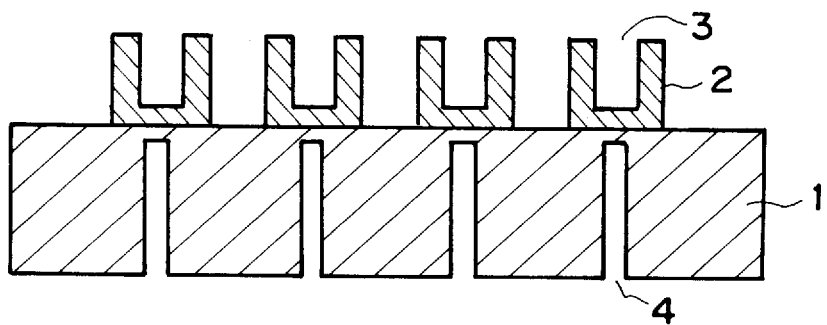
FIG. 5 is a sectional view of an X-ray phase shift mask according to a fourth embodiment of the present invention.

FIG. 5 is an enlarged and sectional view of an X-ray phase shift mask according to a fourth embodiment of the present invention. In this embodiment, an absorbing material 2 and phase shifter 3 are formed on the top surface of the membrane 1, by using the same material. Bores 4 are formed in the bottom surface of the membrane 1 at positions corresponding to the phase shifter 3 pattern. The membrane 1 is made of a silicon carbide film of a thickness 2 microns, the absorbing material 2 is made of tungsten of a thickness 1 micron, and each phase shifter 3 is made of the same material as that of the absorbing material 2.

The refractivities of these materials to X-rays of a wavelength 1 nm are as follows:

| SiC | n = 1 | −0.000406 | −0.000025i |
|-----|-------|-----------|------------|
| W   | n = 1 | −0.0013   | −0.00039i  |

Here, calculating the optimum surface step tm of the membrane 1 and optimum thickness ts of the phase shifter in accordance with equations (1) and (2), it follows that tm=1.55 micron and ts=0.1 micron. Thus, a material W may be formed as the phase shifter 3 with a thickness 0.1 micron, and bores may be formed in membrane 1 with a depth 1.48 micron, at positions corresponding to the shifter.

A mask manufacturing method according to this embodiment of the present invention is as follows. First, a tungsten film is formed on the membrane surface, to a thickness 1 micron. A resist is applied thereto, and an absorptive material pattern and a shifter pattern are formed in accordance with an electron beam pattern drawing process. In that procedure, the exposure amount is changed between the absorptive material pattern and the shifter pattern, such that a thicker resist remains on the absorptive material pattern portion while a thinner resist remains on the shifter pattern portion. Subsequently, while using this resist pattern as a mask, the tungsten is patterned through a dry etching process. During this process, since the resist is thinner at the shifter pattern portion, the resist is exhausted during the dry etching so that the tungsten material is partially etched. In this manner, the absorptive material pattern and the shift pattern are produced simultaneously. Then, a membrane pattern is formed on the bottom surface of the membrane, and, thereafter, by etching the membrane, bores are formed therein.

Since in this embodiment the shifter and the absorptive material are made of the same material, it is not necessary to form the shifter film separately during the mask manufacture. Thus, the productivity of the mask is high.

[Embodiment 5]

Figure 7:
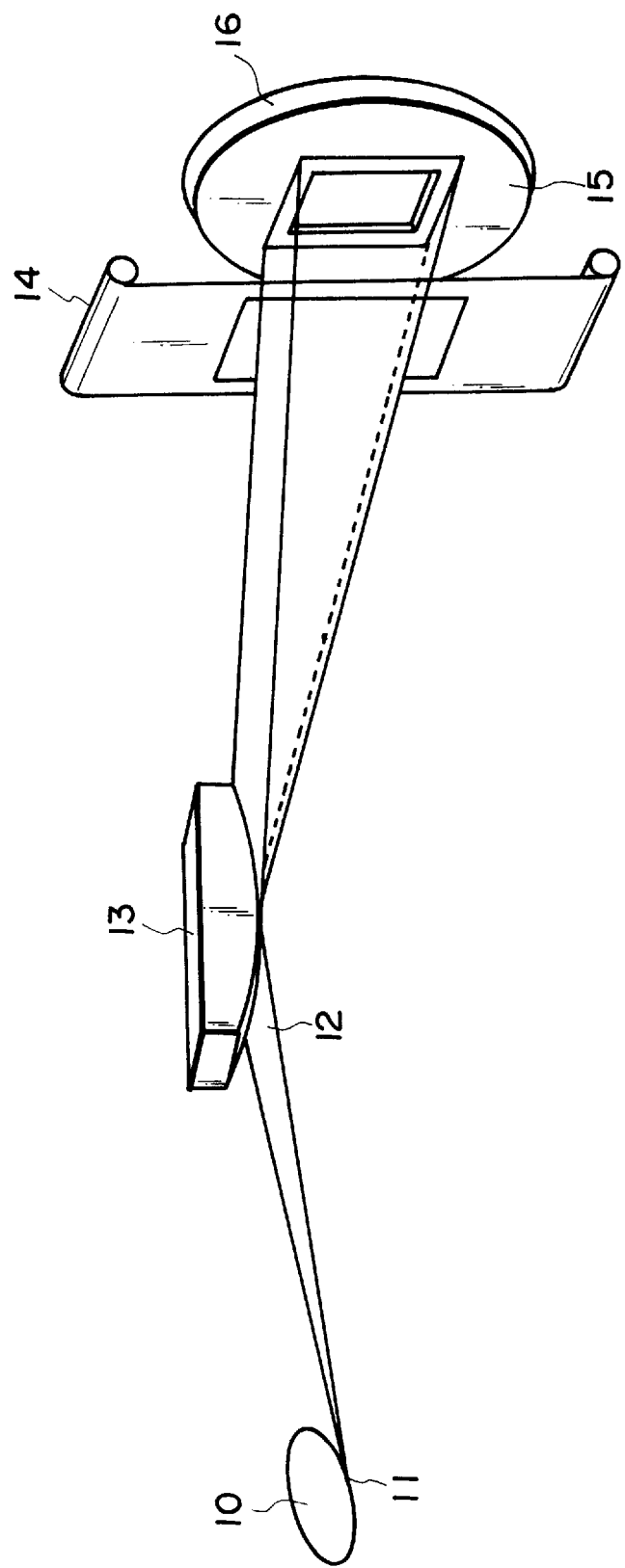
FIG. 7 is a schematic view of a general structure of an X-ray exposure apparatus according to an embodiment of the present invention.

Now, an embodiment of an X-ray exposure apparatus which uses a mask according to any one of the preceding embodiments will be explained. FIG. 7 is a perspective view of a general structure of an X-ray exposure apparatus. In the drawing, a synchrotron radiation source 10 produces, from its light emission point 11, synchrotron radiation light 12 of a sheet-beam shape which is then expanded by a convex mirror 13 having a small curvature, in a direction perpendicular to the radiation orbit plane. The expanded radiation light is adjusted by a movable shutter 14 so as to provide a uniform exposure amount in an irradiation region. The radiation light from the shutter 14 is directed to an X-ray mask 15. The X-ray mask 15 has been produced in accordance with any of the methods described hereinbefore. Wafer 16 is coated with a resist by a spin coating method, to a thickness of 1 micron, and a pre-baking process has been performed thereto under a predetermined condition. The wafer is placed with a small spacing to the X-ray mask, of about 30 microns. Mask patterns are printed onto shot regions on the wafer through stepping exposures. Thereafter, the wafer is collected and a development process is performed thereto.

[Embodiment 6]

Next, a device manufacturing method for manufacturing microdevices by using an X-ray mask and an exposure apparatus described hereinbefore, will be explained.

Figure 8:
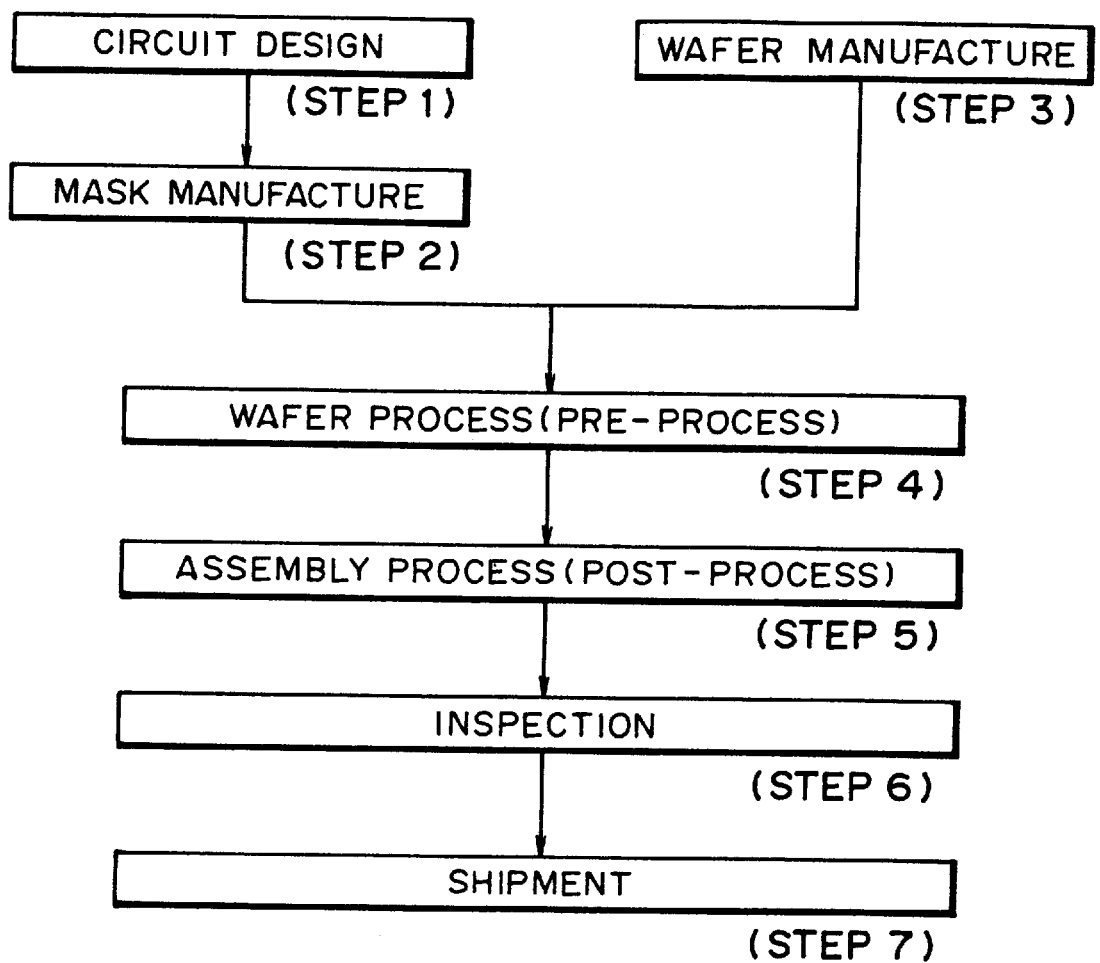
FIG. 8 is a flow chart of semiconductor device manufacturing processes.

FIG. 8 is a flow chart of the sequence of manufacturing microdevices such as semiconductor chips (e.g., ICs or LSIs), liquid crystal panels, CCDs, thin film magnetic heads or micro-machines, for example. Here, the manufacture of semiconductor devices will be explained. Step 1 is a design process for designing the circuit of a semiconductor device. Step 2 is a process for manufacturing a mask on the basis of the circuit pattern design. Step 3 is a process for manufacturing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing).

Step 6 is an inspection step wherein an operability check, a durability check and so on of the semiconductor devices produced by step 5 are carried out. With these processes, semiconductor devices are finished and they are shipped (step 7).

Figure 9:
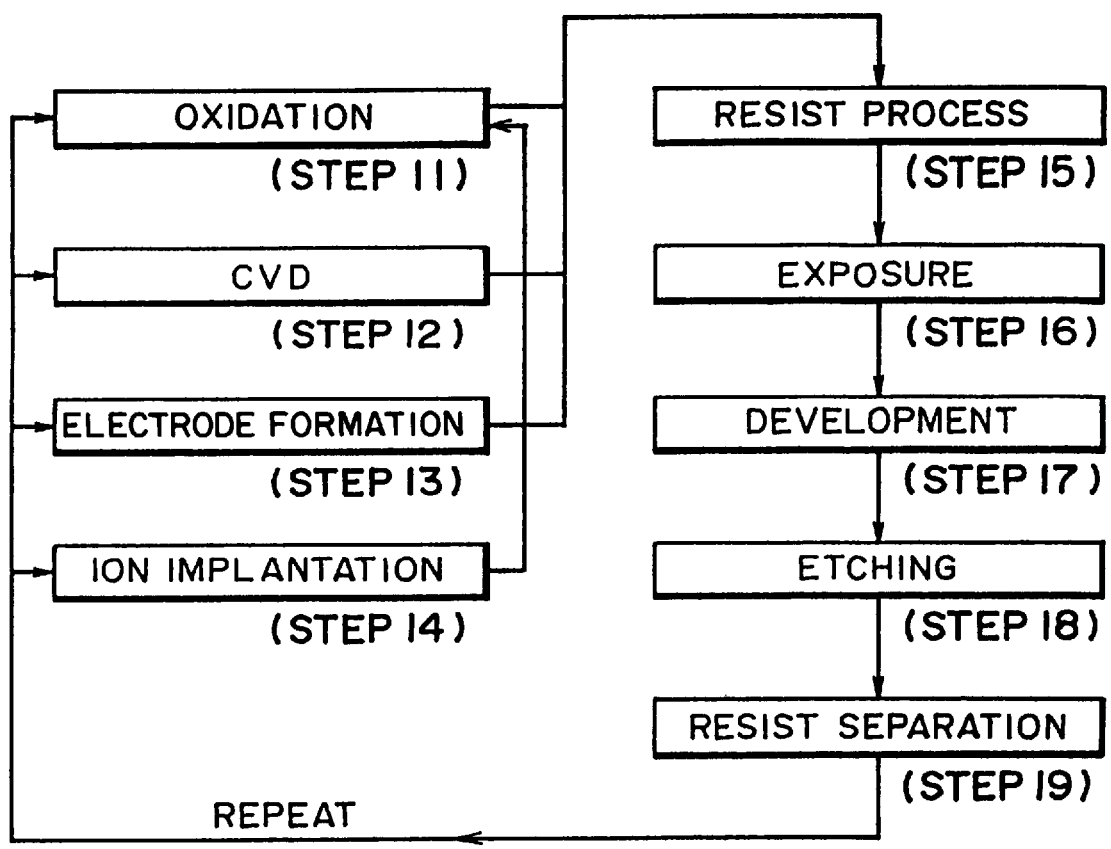
FIG. 9 is a flow chart showing details of a wafer process.
Figure 10:
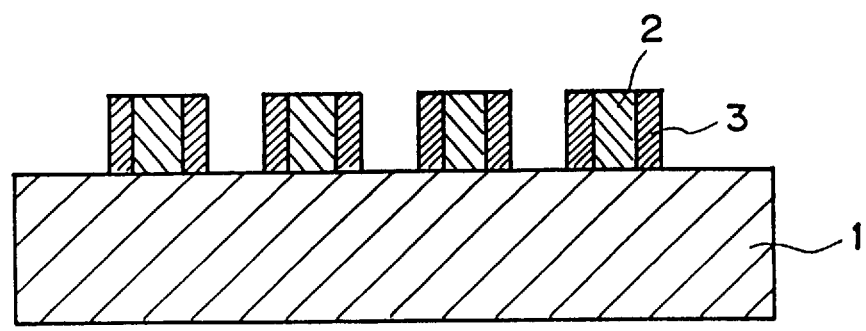
FIG. 10 is a schematic view for explaining operation with a known type phase shift mask. operation of FIGS. 11A–D are illustrations of the operation of a conventional phase shift mask.

FIG. 9 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A mask for use with radiation including one of X-rays or vacuum ultraviolet rays, said mask comprising:
   a transmissive member for supporting a pattern of a radiation absorptive material; and
   a phase shifter material provided on the transmissive member, said phase shifter having a radiation absorptivity less than that of the radiation absorptive material,
   wherein the thickness of the transmissive member at a portion where the phase shifter material is provided is less than that of another portion thereof.

2. A mask according to claim 1, wherein radiation passed through the portion where the phase shifter is provided and radiation passed through a portion where only the transmissive member is provided have substantially the same intensity, but have different phases, being different approximately by π radians.

3. A mask according to claim 2, wherein the following relations are satisfied:

$$tm = \pm ks \times \lambda/(2 \times (km \times \delta s - ks \times \delta m))$$

$$ts = \pm km \times \lambda/(2 \times (ks \times \delta m - km \times \delta s))$$

wherein tm is a surface step of the portion of the transmissive member having a different thickness and ts is the thickness of the phase shifter, $1-\delta m-ikm$ is a complex refractivity of the transmissive member, $1-\delta s-iks$ is a complex refractivity of the phase shifter and λ is the wavelength of the radiation.

4. A mask according to claim 1, wherein the radiation absorptive material and the phase shifter material are made of the same material.

5. A mask according to claim 1, wherein the radiation is synchrotron radiation.

6. An exposure apparatus including means for printing a pattern on a wafer by using a mask as recited in any one of claims 1–5.

7. A device manufacturing method for producing a device by using a mask for use with radiation including one of X-rays or vacuum ultraviolet rays, said method comprising:
   supporting a pattern of a radiation absorptive material on a transmissive member of the mask;
   providing a phase shifter material on the transmissive member, the phase shifter material having a radiation absorptivity less than that of the radiation absorptive material, wherein the thickness of the transmissive member at a portion where the phase shifter material is provided is less than that of another portion thereof; and
   illuminating the mask with radiation including one of X-rays or vacuum ultraviolet rays, for producing a device.

8. A method according to claim 7, wherein radiation passed through the portion where the phase shifter is provided and radiation passed through a portion where only the transmissive member is provided have substantially the same intensity, but have different phases, being different approximately by π radians.

9. A method according to claim 8, wherein the following relations are satisfied:

$$tm = \pm ks \times \lambda/(2 \times (km \times \delta s - ks \times \delta m))$$

$$ts = \pm km \times \lambda/(2 \times (ks \times \delta m - km \times \delta s))$$

wherein tm is a surface step of the portion of the transmissive member having a different thickness and ts is the thickness of the phase shifter, $1-\delta m-ikm$ is a complex refractivity of the transmissive member, $1-\delta m-iks$ is a complex refractivity of the phase shifter and λ is the wavelength of the radiation.

10. A method according to claim 7, wherein the radiation absorptive material and the phase shifter material are made of the same material.

11. A method according to claim 7, wherein the radiation is synchrotron radiation.

* * * * *

UNITED STATES PATENT AND TRADEMARK OFFICE
CERTIFICATE OF CORRECTION

PATENT NO. : 5,770,335
DATED : June 23, 1998
INVENTOR(S) : AKIRA MIYAKE, ET AL.

Page 1 of 2

It is certified that error appears in the above-identified patent and that said Letters Patent is hereby corrected as shown below:

COLUMN 1:

line 40, "electric field of an" should read --an electric field of--.

COLUMN 3:

line 11, "operation of" should be deleted.

COLUMN 4:

line 18, "thickness" should read --thickness of--;
    line 19, "thickness" should read --thickness of--; and
    line 41, "electric field of an" should read --an electric field of--.

COLUMN 7:

line 16, the right margin should be closed up; and
    line 17, the left margin should be closed up.

UNITED STATES PATENT AND TRADEMARK OFFICE
CERTIFICATE OF CORRECTION

PATENT NO. : 5,770,335
DATED : June 23, 1998
INVENTOR(S) : AKIRA MIYAKE, ET AL.

It is certified that error appears in the above-identified patent and that said Letters Patent is hereby corrected as shown below:

COLUMN 8:

line 53, "1-$\delta$m-iks" should read -- 1-$\delta$s-iks --.

Signed and Sealed this

Thirteenth Day of April, 1999

Attest:

Q. TODD DICKINSON

Attesting Officer

Acting Commissioner of Patents and Trademarks